US008747122B2

(12) United States Patent  
Banitt et al.

(10) Patent No.: US 8,747,122 B2  
(45) Date of Patent: Jun. 10, 2014

(54) IMPLEMENTING CONNECTION OF TWO LARGE ELECTRONIC BOARDS UTILIZING LGA INTERCONNECT

(75) Inventors: Terry F. Banitt, Altura, MN (US); John L. Colbert, Byron, MN (US); Jason R. Eagle, Kasson, MN (US); Roger S. Krabbenhoft, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1022 days.

(21) Appl. No.: 12/821,312

(22) Filed: Jun. 23, 2010

(65) Prior Publication Data

US 2014/0127915 A1 May 8, 2014

(51) Int. Cl.  
*H01R 12/00* (2006.01)

(52) U.S. Cl.  
USPC ............................................ 439/66

(58) Field of Classification Search  
USPC ................................ 439/66, 74, 91  
See application file for complete search history.

(56) References Cited

U.S. PATENT DOCUMENTS

| | | | |
|---|---|---|---|
| 4,548,451 A * | 10/1985 | Benarr et al. | 439/85 |
| 5,793,618 A * | 8/1998 | Chan et al. | 361/809 |
| 6,386,890 B1 * | 5/2002 | Bhatt et al. | 439/67 |
| 7,785,111 B2 * | 8/2010 | Hilty et al. | 439/66 |
| 8,191,245 B2 * | 6/2012 | Hougham et al. | 29/842 |
| 2007/0232090 A1 * | 10/2007 | Colgan et al. | 439/66 |
| 2009/0042414 A1 * | 2/2009 | Hougham et al. | 439/66 |
| 2009/0186495 A1 * | 7/2009 | Taylor | 439/66 |

* cited by examiner

*Primary Examiner* — Gary Paumen  
(74) *Attorney, Agent, or Firm* — Joan Pennington (57) ABSTRACT

A method and apparatus are provided for implementing electrical connection of two large circuit cards through multiple discrete land grid array (LGA) sites. Each of the circuit cards includes a plurality of LGA sites. A first circuit card includes a plurality of LGA interposers locally aligned at the respective LGA sites of the first circuit card. A board-to-board connection hardware assembly connecting a second circuit card to the first circuit card includes a elongated carrier defining a cavity receiving a plurality of load springs coupled to an associated bearing block for loading and maintaining flatness of the LGA sites.

20 Claims, 6 Drawing Sheets

IMPLEMENTING CONNECTION OF TWO LARGE ELECTRONIC BOARDS UTILIZING LGA INTERCONNECT

STATEMENT REGARDING FEDERALLY SPONSORED RESEARCH OR DEVELOPMENT

This invention was made with Government support under Contract No. HR0011-07-9-0002 awarded by the Department of Defense. The Government has certain rights in this invention.

FIELD OF THE INVENTION

The present invention relates generally to the data processing field, and more particularly, relates to a method and apparatus for implementing electrical connection of two large circuit cards through multiple discrete land grid array (LGA) sites.

DESCRIPTION OF THE RELATED ART

It is often necessary to connect two large circuit cards together. Many methods have been used to connect two circuit cards, including connectors, cables, direct soldering, and Z-interconnect. With an extremely high number of electrical connections, such as over 15,000, and with minimal space available, several known options for interconnect are not possible. There is not enough room for a board-to-board housed connector scheme, or cabling. At a high operating frequency, it is possible these two options would not work due to high impedance levels even if space were available for their implementation. The Z-interconect is a possibility for this connection, but the high associated cost makes this prohibitive. Land grid array (LGA) interconnect technologies are used in many electronic applications.

Figure 6:
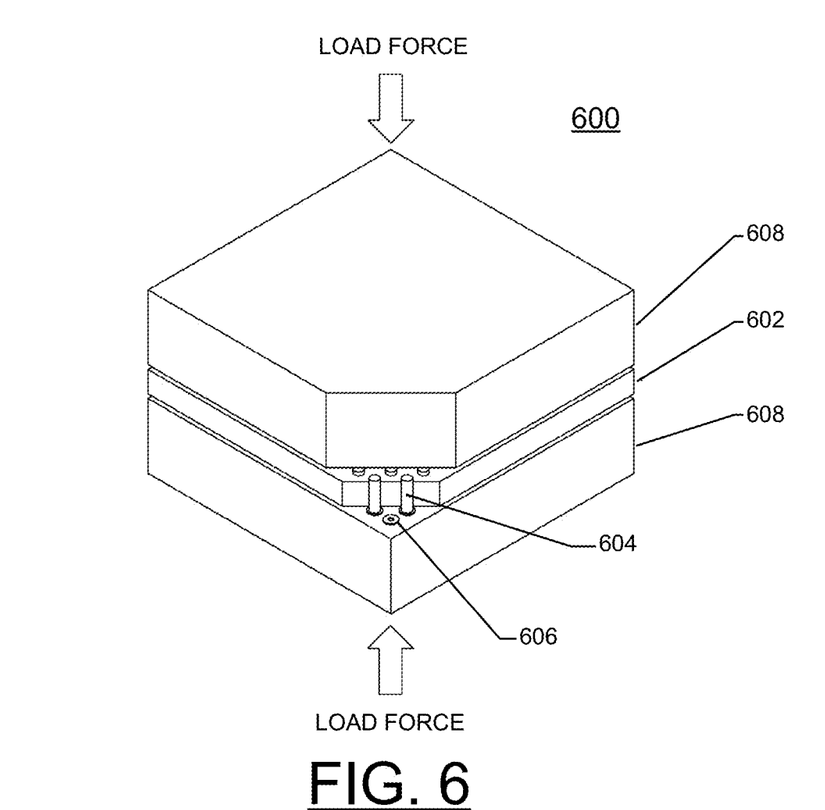
FIG. 6 illustrates a land grid array (LGA) interface.

FIG. 6 illustrates a land grid array (LGA) interface 600 includes an LGA socket or interposer 602 with an array of LGA contacts 604 used to create mechanically loaded electrical connections with between contact pads 606 present on circuit cards 608 with arrows indicating loading force. Multiple LGA technologies are available, and the LGA interface is not limited to any specific technology. LGA connector technologies typically must operate under a relatively tight range of mechanical loading conditions to ensure that individual contacts in the array achieve consistent interconnection mating loads for high initial yields at the time of assembly and for long term field reliability. Variations in circuit cards 608 can produce significant LGA contact load non-uniformities resulting in potential problems, such as loss of electrical continuity of individual contact members in the LGA array.

A need exists for an effective mechanism for implementing electrical connection of two large circuit cards.

SUMMARY OF THE INVENTION

Principal aspects of the present invention are to provide a method and apparatus for implementing electrical connection of two large circuit cards through multiple discrete land grid array (LGA) sites. Other important aspects of the present invention are to provide such method and apparatus substantially without negative effect and that overcome many of the disadvantages of prior art arrangements.

In brief, a method and apparatus are provided for implementing electrical connection of two large circuit cards through multiple discrete land grid array (LGA) sites. Each of the circuit cards includes a plurality of LGA sites. A first circuit card includes a plurality of LGA interposers; each LGA interposer is locally aligned at a respective LGA site of the first circuit card. A board-to-board connection hardware assembly connecting a second circuit card to the first circuit card includes a elongated carrier defining a cavity receiving a plurality of load springs coupled to an associated bearing block for loading and maintaining flatness of the LGA sites.

In accordance with features of the invention, the second circuit card is secured in a neutral position without influencing the board-to-board connections of the first and second circuit cards. Each of the first circuit card and the second circuit card is mounted on an associated stiffener member. A pair of brackets is located on the chassis, each bracket having a horizontal surface that carries a stiffener plate mounted to the second circuit card during the assembled mating of the two circuit cards, and a bracket slot for receiving a horizontal screw that secures the second circuit card to the neutral position, then the bracket is fastened to the chassis.

In accordance with features of the invention, the plurality of LGA interposers includes alignment features for aligning with the LGA sites on the first circuit card. The elongated carrier includes a plurality of tapered openings receiving and retaining the plurality of load springs. The elongated carrier is formed of a sheet metal material. A plurality of spring stiffener blocks is mounted to the elongated carrier proximate to the respective tapered openings. A pair of retention screws is installed through aligned openings in the respective spring stiffener blocks, the elongated carrier, and the insulator, forming a modular unit that can be turned in any direction, and the assembly parts are retained together.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing electrically connections of two large circuit cards through a plurality of discrete land grid array (LGA) sites. A chassis assembly is provided with a board-to-board connection hardware assembly, which accurately locates, loads, and maintains the flatness of each of the plurality of discrete LGA sites.

In accordance with features of the invention, the method and apparatus for implementing electrically connections of two large circuit cards have the advantages of relatively low cost, and being reliable, reworkable, and capable of handling very high frequency signals. Electrical connections are implemented at multiple LGA sites along a card edge that is approximately 30 inches, of two large circuit cards. If one of the circuit cards becomes defective after the two circuit cards are connected, the LGA interconnect can be separated, and the card assembly can be reworked.

Figure 1:
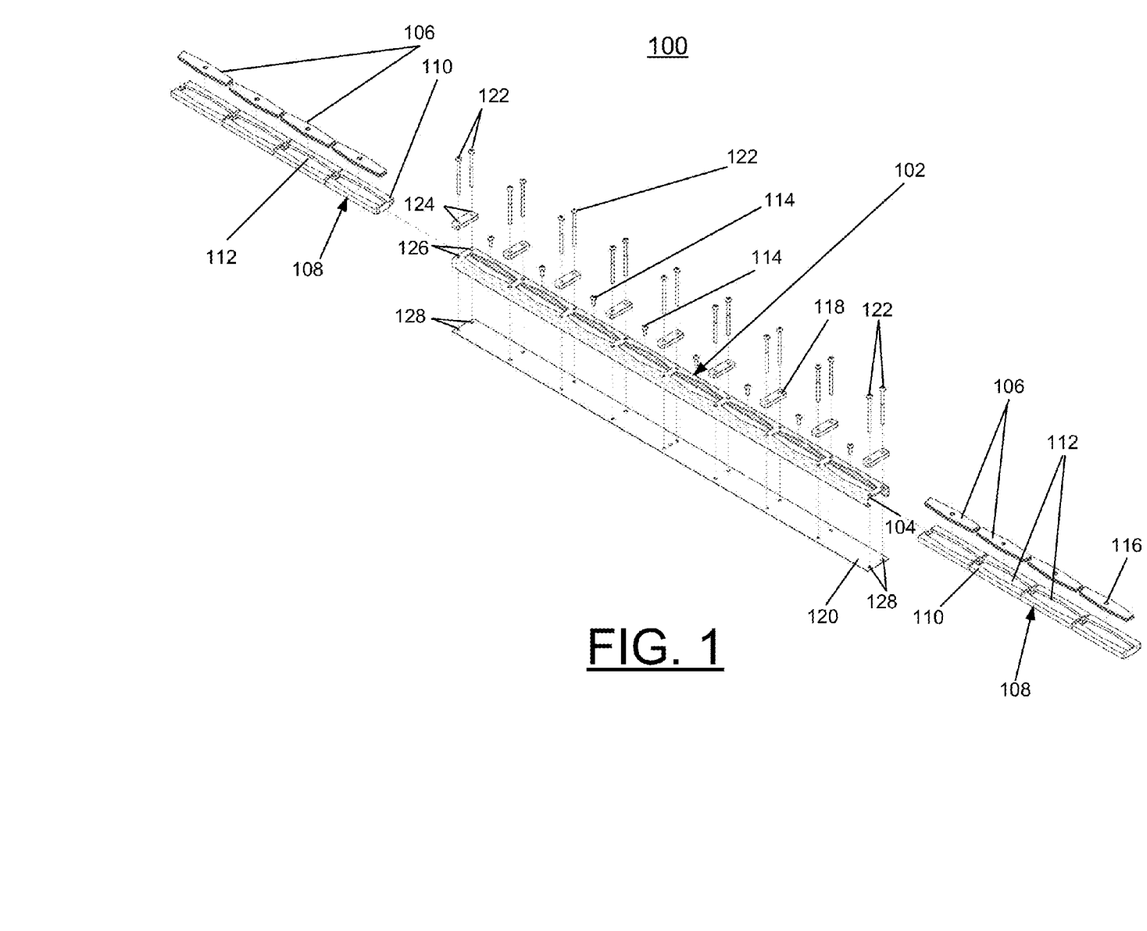
FIG. 1 is an exploded perspective view not to scale of a board-to-board connection hardware assembly in accordance with the preferred embodiment.
Figure 2:
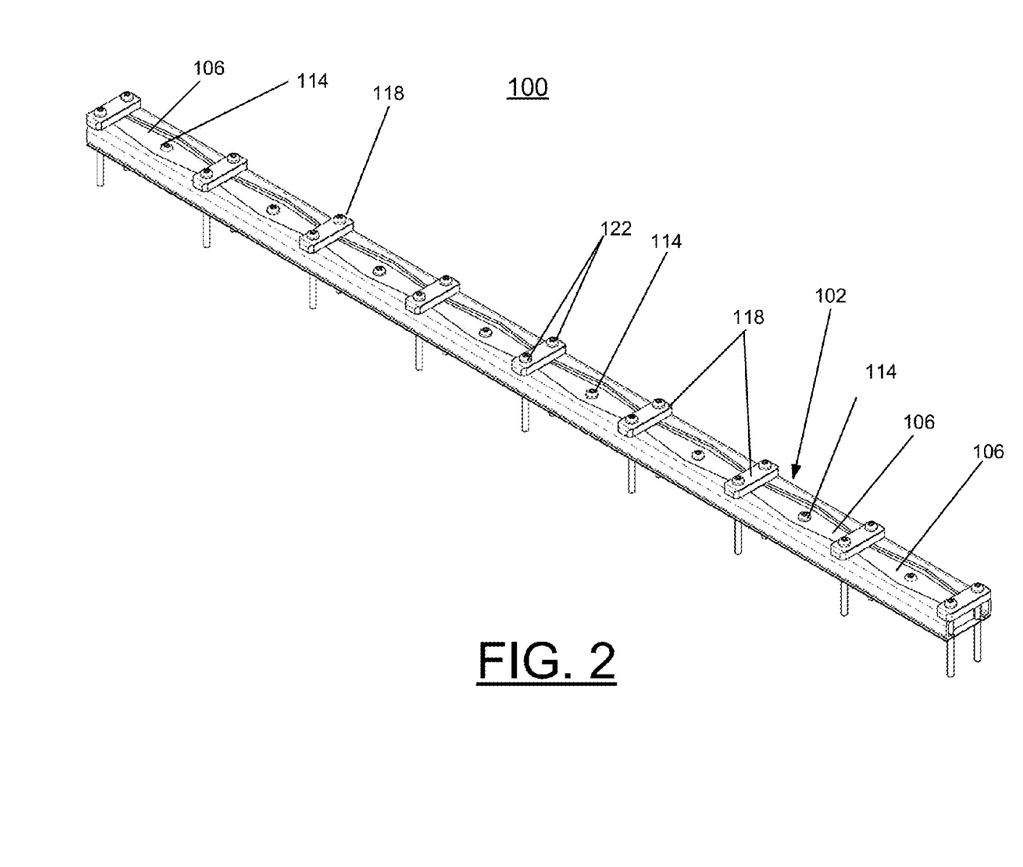
FIG. 2 is a perspective view not to scale of the board-to-board connection hardware assembly of FIG. 1 in accordance with the preferred embodiment.

Having reference now to the drawings, in FIGS. 1 and 2, there is shown a board-to-board connection hardware assembly generally designated by the reference character 100 in accordance with the preferred embodiment. The board-to-board connection hardware assembly 100 is used for connecting a first circuit card and a second circuit card in accordance with the preferred embodiment. The first circuit card and second circuit card include a plurality of discrete land grid array (LGA) sites, for example 8 LGA sites, implementing, for example, more than 15,000 electrical connections.

Referring to FIG. 1, the board-to-board connection hardware assembly 100 includes an elongated carrier 102 defining a cavity 104 receiving a plurality of load springs 106 and a pair of associated bearing blocks 108 that serve for independently loading and maintaining flatness of multiple corresponding LGA sites. The elongated carrier 102 is a large sheet metal carrier, which contains flat load springs 106 and bearing blocks 108.

The plurality of load springs 106 interfaces with the bearing blocks 108 to keep the bearing blocks aligned over the respective LGA connection sites. The load springs 106 are laminated load springs, for example, formed of pre-tempered high carbon steel. The bearing blocks 108 are formed of a flat bottom steel plate and include a plastic member 110 defining a respective double-tapered spring alignment and retention feature 112 receiving the respective load spring 106. This spring alignment and retention feature 112 keeps the flat load springs 106 from shifting position in both lateral and rotational directions and ensures the spring force does not vary, and that the flat load springs 106 cannot come free under load.

In assembled condition as shown in FIG. 2, a respective load screw 114 is installed into a generally central opening 116 in the flat load springs 106, and engaging the top of the bearing block 108 in loading operation after the board-to-board connection hardware assembly 100 is connected with the circuit boards.

The board-to-board connection hardware assembly 100 includes a plurality of spring stiffener blocks 118 mounted to the elongated carrier 102 proximate to opposite ends of each of the flat load springs 106. The board-to-board connection hardware assembly 100 includes an elongated insulator sheet member 120 located at the bottom of the assembly, which serves to protect the mating circuit card from the sheet metal carrier 102, as well as capture screws in the assembly.

A respective pair of retention screws 122 is installed through respective aligned openings 124, 126, 128 in each of the respective spring stiffener blocks 118, the elongated carrier 102, and the insulator 120, forming a modular unit that can be turned in any direction, and the assembly parts are retained together. This feature avoids potential problems of small parts that could create damage to the circuit card if they were not retained in the modular unit assembly 100.

As shown in the illustrated assembly 100, there are 18 retention screws 122 that serve to bring the circuit cards to be connected into close proximity under a light screw torque. This removes slop from the connection, insuring that the load screw 114 is applying a load to the load springs 106 when it is actuated, rather than removing air gap if the cards are not closely situated. These 18 retention screws 122 protrude through the insulator sheet member 120 at the bottom of the assembly 100. Once these 18 retention screws 122 are installed into the assembly, the assembly 100 is defined as an integral modular unit as illustrated in FIG. 2.

Figure 3:
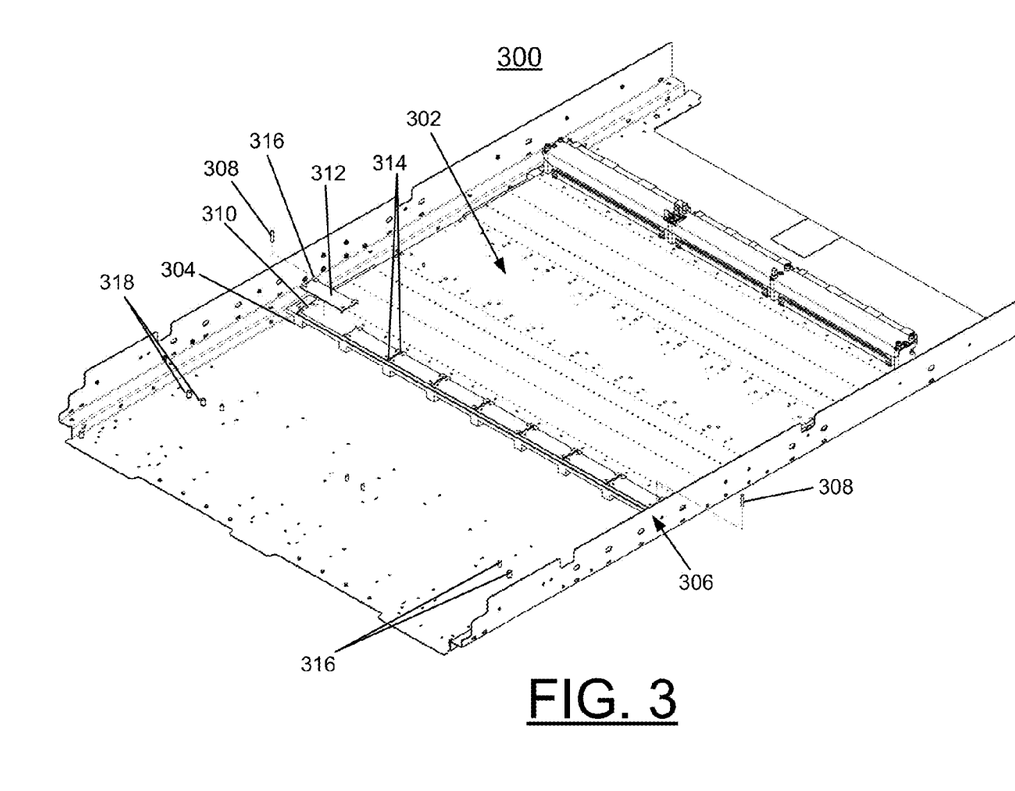
FIG. 3 is a perspective view not to scale a first circuit card and chassis assembly in accordance with the preferred embodiment.

Referring now to FIG. 3, there is shown an initial circuit card and chassis assembly generally designated by the reference character 300 in accordance with the preferred embodiment. The initial circuit card and chassis assembly 300 includes a first circuit card 302 mounted to an associated stiffener member 304 and mounted to a chassis 306. For example, the backside stiffener member 304 aligns the first circuit card 302 via a central press-fit dowel pin (not shown). Once the circuit card 302 is placed on the stiffener member 304, a pair of outer dowel pins 308 is inserted through a pair of corresponding outer card holes 310 into an aligned blind, machined slot in the stiffener member 304. The use of the aligned blind, machined slot 310 in the stiffener member 304 avoids a potential card-to-card hole tolerance binding problem that could otherwise result with three pins pressed into a machined plate. The assembly 300 provides a global alignment arrangement with dowel pins 308 ensuring that the circuit cards can be pinned together.

After the circuit card 302 is placed, a plurality of LGA interposers 312, such as 8 LGA interposers, is locally aligned at their respective discrete LGA sites spaced apart along predefined input/output (I/O) areas of the circuit card 302. The circuit card 302 includes a plurality of alignment openings 314 adjacent each of the plurality of LGA interposers 312 receiving the respective pairs of retention screws 122 of the board-to-board connection hardware assembly 100. Each of the plurality of LGA interposers 312 includes alignment features 316 and includes respective plastic alignment pins (not shown) pressed into the first circuit card 302. There are no interposer alignment features with respect to the corresponding respective discrete LGA sites spaced apart along predefined input/output (I/O) areas of the second circuit card shown in FIGS. 4 and 5. This side of the connector depends on the accuracy of the global alignment features.

Figure 4:
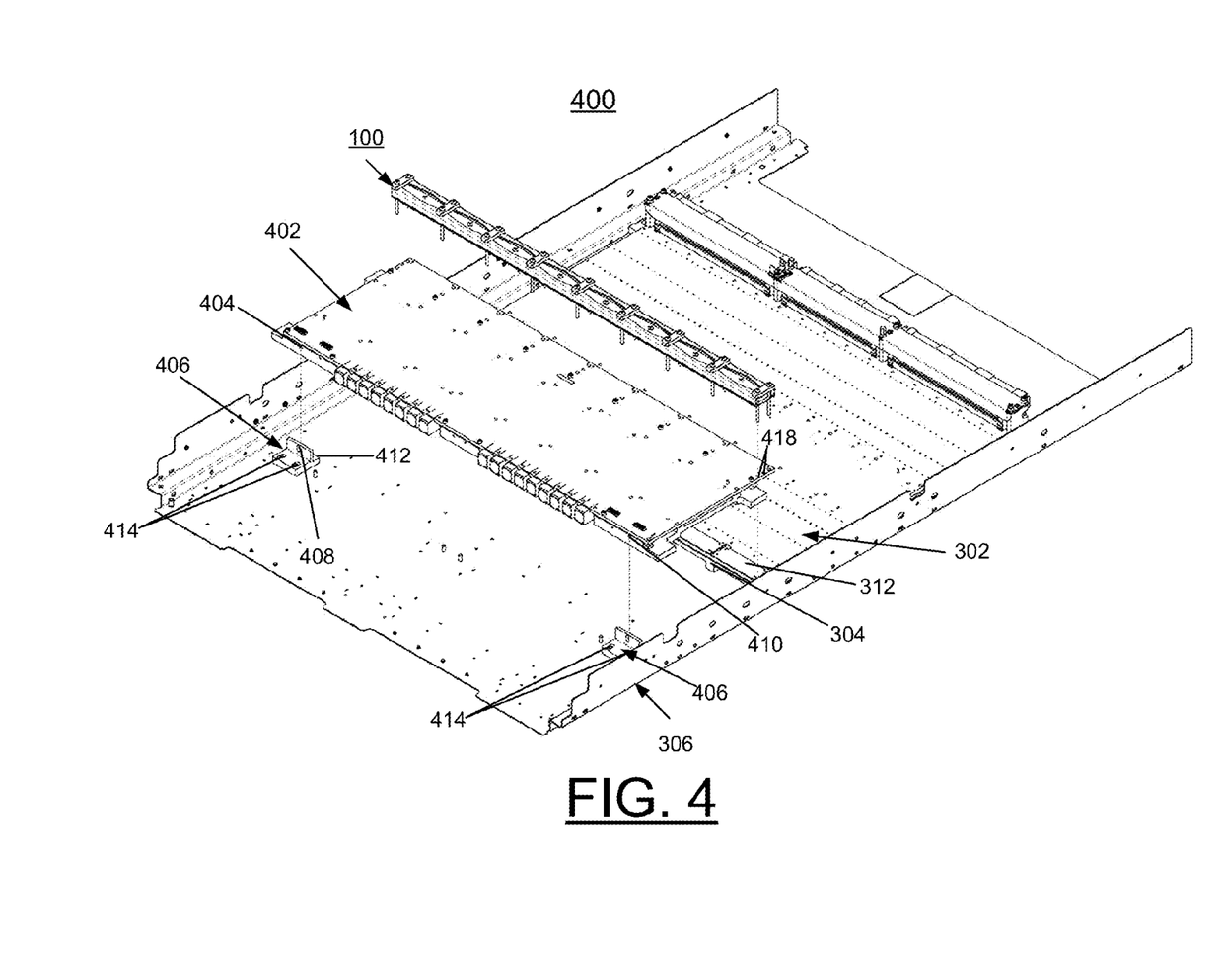
FIG. 4 is an exploded perspective view not to scale the first circuit card and chassis assembly with a second circuit card and the board-to-board connection hardware assembly of FIG. 1 in accordance with the preferred embodiment.
Figure 5:
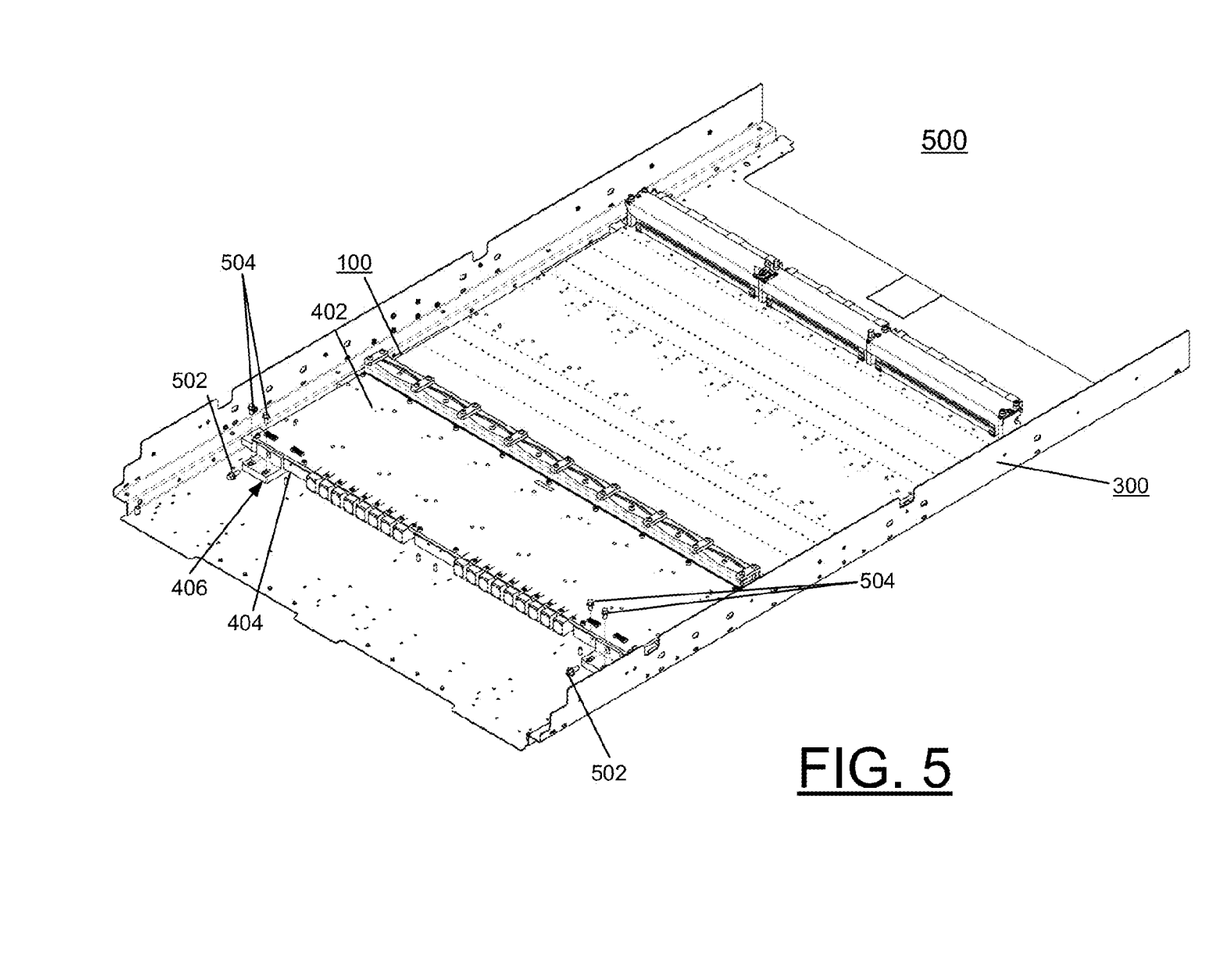
FIG. 5 is a perspective view not to scale an assembly of the first circuit card and chassis assembly with a second circuit card and the board-to-board connection hardware assembly of FIG. 4 in accordance with the preferred embodiment.

The circuit card and chassis assembly 300 includes a plurality of bracket locating standoffs 318 pressed into the chassis 306 at the rear of the system 300 used for locating a pair of brackets 406, shown in FIGS. 4 and 5. The pair of brackets 406 is used for securing the second circuit card in a neutral position without influencing the board-to-board connections of the first and second circuit cards.

Referring now to FIG. 4, there is shown a next step of assembly generally designated by the reference character 400 in accordance with the preferred embodiment. Assembly 400 includes the first circuit card 302 mounted to the chassis 306, a second circuit card 402, and the board-to-board connection hardware assembly 100 to be connected with the first and second circuit cards 302 and 402.

As shown in FIG. 4 assembly 400 includes the second circuit card 402 mounted to a stiffener plate member 404 and the pair of brackets 406. The brackets 406 are placed at the rear of the assembly 400 on the standoffs 318 before the second circuit card 402, which is mounted to stiffener plate member 404 is lowered into position over the board-to-board dowel pins 308. The brackets 406 are designed to lock the second card 402 into a neutral position without generating a force that can influence the connection of the board-to-board connection hardware assembly 100. The brackets 406 include an opening 408 for receiving a horizontal screw, which is inserted into an opening 410 in the stiffener plate member 404 to secure the second card 402 into the neutral position. The brackets 406 have a horizontal surface 412 that the stiffener member 404 rests upon during the mating of the two cards 302, 402. The height of this surface 412 is set to a lowest possible height for the assembly, so that if the first circuit card 302 and its hardware were at the thinnest possible condition, the two cards 302, 402 would be parallel.

The brackets 406 are not secured to the chassis 306 or are loose, as circuit card 402 is lowered into position onto the board-to-board dowel pins 308. The brackets 406 are left loose until after all the board-to-board connections are made, with the spring loads applied by the board-to-board connection hardware assembly 100. The brackets 406 include a pair of openings 414 receiving fasteners to mount the bracket 406 to the chassis 306. The second circuit card 402 and stiffener plate member 404 include respective aligned pairs of openings for receiving the respective pairs of retention screws 122 of the board-to-board connection hardware assembly 100.

Referring now to FIG. 5, there is shown a next step of assembly generally designated by the reference character 500 in accordance with the preferred embodiment. The assembly 500 illustrates the board-to-board connection hardware assembly 100 connected with the first and second circuit cards 302 and 402 after the assembly has been sequentially torqued with retention screws 122 to bring the circuit cards 302, 402 into close contact. The load blocks 108 are then loaded via the load screws 114 deflecting the simply supported flat spring plates 106. Each load screw 114 deflects its flat spring plate 106 and the screw tip of each load screw 114 presses onto the respective bearing block 108, generating sufficient load to make a reliable LGA interconnect, for example, 40-60 grams per contact. Pressing the load screw 114 directly in the center of the respective bearing block 108 provides a center point load achieving matched deflection through the hardware stack of the circuit boards 302, 402, stiffener members 302, 404, and LGA interposer 314. The length of the screw 114 and rate of the spring 106 are tailored to generate this load with a high degree of precision, and the spring rate is sufficiently soft that the load will not vary widely due to thickness tolerances of the individual components.

After the board-to-board connection hardware assembly 100 at the board-to-board interface is loaded, it is expected that the opposite end of the second card stiffener member 404 lift from the surface 412 of the rear brackets 406. At this time, a horizontal screw 502 is inserted into the bracket opening 408 and opening 410 in the stiffener plate member 404 to secure the second circuit card 402 into the neutral position in each bracket slot 408. The bracket 406 is then fastened to the chassis 306 by a pair of screws or fasteners 504. The card thickness and other tolerances of the supporting hardware prohibit screwing the second circuit card 402 to a fixed height, as this could reduce contact force at either end of the board-to-board LGA connection, depending on if the oppose end of the second circuit card 402 is high or low. The bracket 406 is arranged to secure the end of second circuit card 402 opposite the board-to-board interconnect assembly 100, without having any influence on this connection.

While the present invention has been described with reference to the details of the embodiments of the invention shown in the drawing, these details are not intended to limit the scope of the invention as claimed in the appended claims.

What is claimed is:

1. An apparatus for implementing electrical connection of two circuit cards through multiple discrete land grid array (LGA) sites comprising:
   a first circuit card;
   a plurality of LGA interposers, each LGA interposer locally aligned at a respective LGA site of said first circuit card;
   a board-to-board connection hardware assembly connecting a second circuit card to said first circuit card; said board-to-board connection hardware assembly including a elongated carrier defining a cavity receiving a plurality of load springs coupled to an associated bearing block for loading and maintaining flatness of the LGA sites and LGA interposers.

2. The apparatus as recited in claim 1 wherein each of said the plurality of LGA interposers includes alignment features for aligning with the LGA sites spaced apart along predefined input/output (I/O) areas near a card edge of said first circuit card, wherein said card edge is approximately 30 inches long.

3. The apparatus as recited in claim 1 wherein said elongated carrier includes a plurality of tapered openings receiving and retaining the plurality of load springs.

4. The apparatus as recited in claim 3 wherein said elongated carrier is formed of a sheet metal material.

5. The apparatus as recited in claim 3 wherein said board-to-board connection hardware assembly includes a plurality of spring stiffener blocks mounted to said elongated carrier proximate to the respective tapered openings.

6. The apparatus as recited in claim 5 wherein said board-to-board connection hardware assembly includes an insulator sheet disposed below said elongated carrier.

7. The apparatus as recited in claim 6 includes a respective pair of retention screws installed through aligned openings in the respective spring stiffener blocks, said elongated carrier, and the insulator sheet to define a modular unit.

8. The apparatus as recited in claim 7 wherein said retention screws are installed through said first and second circuit cards and serve to bring said first and second circuit cards into close proximity under an initial screw torque.

9. The apparatus as recited in claim 1 wherein said board-to-board connection hardware assembly includes a plurality of load screws, each load screw being installed substantially at a center point with a respective load spring of said plurality of load springs engaging the respective bearing block.

10. The apparatus as recited in claim 9 wherein each said load screw and said respective load spring engaging the respective bearing block generate a set load for reliable LGA interconnect contact.

11. The apparatus as recited in claim 1 wherein each of said first circuit card and said second circuit card is mounted to an associated stiffener member.

12. The apparatus as recited in claim 11 includes a chassis carrying said first circuit card and a pair of brackets located on said chassis.

13. The apparatus as recited in claim 12 wherein each of said brackets includes a surface supporting said associated stiffener member of said second circuit card, and includes a bracket slot for receiving a horizontal screw engaging said associated stiffener member of said second circuit card to secure said second circuit card at a set position.

14. The apparatus as recited in claim 13 wherein each of said brackets is mounted to said chassis, including mounting apertures receiving mounting screws.

15. A method for implementing electrical connection of two circuit cards through multiple discrete land grid array (LGA) sites comprising:

provding a first circuit card with a plurality of LGA sites;

providing a plurality of LGA interposers, each LGA interposer locally aligned at a respective LGA site of said first circuit card;

providing a board-to-board connection hardware assembly including a elongated carrier defining a cavity receiving a plurality of load springs coupled to an associated bearing block for loading and maintaining flatness of the LGA sites and LGA interposers; and connecting a second circuit card to said first circuit card with said board-to-board connection hardware assembly.

16. The method as recited in claim 15 includes providing said elongated carrier with a plurality of tapered openings receiving and retaining the plurality of load springs.

17. The method as recited in claim 16 includes providing a plurality of spring stiffener blocks mounted to said elongated carrier proximate to the respective tapered openings, and providing an insulator sheet disposed below said elongated carrier.

18. The method as recited in claim 17 includes installing a respective pair of retention screws through cooperating aligned openings in said respective spring stiffener blocks, said elongated carrier, and said insulator sheet to define a modular unit.

19. The method as recited in claim 18 wherein connecting a second circuit card to said first circuit card with said board-to-board connection hardware assembly includes installing said respective pair of retention screws through cooperating aligned openings in said second circuit card and said first circuit card, and installing a respective load screw with a respective load spring of said plurality of load springs engaging the respective bearing block to generate a set load for reliable LGA interconnect contact.

20. The method as recited in claim 15 includes providing a bracket with a bracket slot to secure an opposed end of said second circuit card at a set position.

* * * * *